(12) United States Patent
Zhu (10) Patent No.: US 7,741,645 B2
(45) Date of Patent: Jun. 22, 2010

(54) THREE-DIMENSIONAL INTEGRATED HETEROGENEOUS SEMICONDUCTOR STRUCTURE

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/127,987

(22) Filed: May 28, 2008

(65) Prior Publication Data
US 2009/0294984 A1    Dec. 3, 2009

(51) Int. Cl.
  H01L 29/76      (2006.01)
  H01L 31/036     (2006.01)
  H01L 31/112     (2006.01)

(52) U.S. Cl. .............................. 257/67; 257/68; 257/69; 257/70

(58) Field of Classification Search .............. 257/67–70
See application file for complete search history.

(56) References Cited

U.S. PATENT DOCUMENTS

| | | | |
|---|---|---|---|
| 7,214,993 B2 * | 5/2007 | Yang | 257/401 |
| 2005/0067620 A1 | 3/2005 | Chan et al. | |
| 2006/0292880 A1 * | 12/2006 | Son et al. | 438/705 |
| 2007/0145367 A1 | 6/2007 | Chen et al. | |
| 2007/0181953 A1 * | 8/2007 | Lyu et al. | 257/382 |

* cited by examiner

Primary Examiner—Thien F Tran
(74) Attorney, Agent, or Firm—Scully, Scott, Murphy & Presser, P.C.; H. Daniel Schnurmann (57) ABSTRACT

A first set of semiconductor devices is formed on a first semiconductor substrate comprising a first semiconductor material having a first melting point. A first via-level dielectric layer containing first contact vias is formed on the first semiconductor substrate. A second semiconductor substrate comprising a second semiconductor material having a second melting point lower than the first melting point is formed either by bonding or deposition. A second set of semiconductor devices is formed on the second semiconductor substrate. A second via-level dielectric layer, second contact vias contacting the second set of semiconductor devices, and inter-substrate vias electrically connecting the first contact vias are thereafter formed. A metal interconnect layer containing a metal interconnect structure is formed over the second via-level dielectric layer to electrically connect the first and second set of semiconductor devices through the second contact vias and the inter-substrate vias.

12 Claims, 7 Drawing Sheets

THREE-DIMENSIONAL INTEGRATED HETEROGENEOUS SEMICONDUCTOR STRUCTURE

FIELD OF THE INVENTION

The present invention relates to a semiconductor structure, and particularly to a three-dimensional integrated semiconductor structure employing heterogeneous semiconductor layers, and methods of manufacturing the same.

BACKGROUND OF THE INVENTION

Three-dimensional semiconductor structures in which a plurality of layers containing semiconductor devices are formed on the same semiconductor substrate provide the advantage of increasing semiconductor device density without resorting to device scaling. The increase in the areal device density may be advantageously employed in facilitating fabrication of high performance semiconductor chips in which average wiring length between devices is shorter than in conventional semiconductor chips containing semiconductor devices fabricated in a single semiconductor layer. Reduction of the average wiring length results in a decrease in signal delay between gates, and consequently, in a faster device switching.

The increase in the areal density may also be advantageous for packaging purposes. Specifically, a semiconductor chip employing three-dimensional semiconductor structures with a plurality of layers containing semiconductor devices may be fitted in a smaller package than a conventional semiconductor chip containing only one layer for semiconductor devices performing the same function. Due to such advantages of three-dimensional semiconductor structures, various methods for forming such three-dimensional semiconductor structures have been disclosed in the prior art.

One of the most challenging aspect of prior art methods for the manufacture of three-dimensional semiconductor devices is the effect of thermal cycling needed to form semiconductor devices in a subsequently formed semiconductor layer on the device characteristics of pre-existing semiconductor devices in a previously formed semiconductor layer. This problem can be egregious in terms of diffusion of dopants in the previously formed semiconductor layer since excessive thermal cycling may result in blurred interface between doped regions and/or deactivation of dopants resulting in poor device performance.

In view of the above, there exists a need for a three-dimensional semiconductor structure that does not provide degradation of performance due to inherent limitations in the processing sequence, and methods of manufacturing the same.

Particularly, there exists a need for a three-dimensional semiconductor structure in which thermal cycling employed for a subsequently manufactured set of semiconductor devices does not adversely impact the device performance of a previously manufactured set of semiconductor devices.

SUMMARY OF THE INVENTION

The present invention addresses the needs described above by providing a three-dimensional semiconductor structure comprising a first semiconductor layer containing a first set of semiconductor devices and a second semiconductor layer containing a second set of semiconductor devices and comprising a semiconductor material having a lower melting point than the semiconductor material of the first semiconductor layer, and methods of manufacturing the same.

In the present invention, a first set of semiconductor devices is formed on a first semiconductor substrate comprising a first semiconductor material having a first melting point. A first via-level dielectric layer containing first contact vias is formed on the first semiconductor substrate. A second semiconductor substrate comprising a second semiconductor material having a second melting point lower than the first melting point is formed either by bonding or deposition. A second set of semiconductor devices is formed on the second semiconductor substrate. A second via-level dielectric layer is formed over the second semiconductor substrate, and second contact vias contacting the second set of semiconductor devices and inter-substrate vias contacting the first contact vias or a metal interconnect structure abutting the first contact vias are formed in the second via-level dielectric layer. A metal interconnect layer containing a metal interconnect structure electrically connecting the second contact vias and the inter-substrate vias is formed over the second via-level dielectric layer.

According to an aspect of the present invention, a semiconductor structure is provided, which comprises:

a first semiconductor substrate comprising a first semiconductor material having a first melting point;

a first set of semiconductor devices abutting the first semiconductor substrate;

a via-level dielectric layer located on the first set of semiconductor devices and containing first contact vias contacting the first set of semiconductor devices;

a second semiconductor substrate located over the first semiconductor substrate and the first set of semiconductor devices and comprising a second semiconductor material having a second melting point, wherein the second melting point is lower than the first melting point; and a second set of semiconductor devices abutting the second semiconductor substrate.

The semiconductor structure may further comprise another via-level dielectric layer located on the second set of semiconductor devices and containing second contact vias contacting the second set of semiconductor devices and inter-substrate vias electrically connected to the first set of semiconductor devices, and a set of metal lines embedded in an interconnect level dielectric layer and vertically abutting the second contact vias and the inter-substrate vias.

The first semiconductor substrate may be single crystalline and the second semiconductor substrate may be single crystalline or polycrystalline. The semiconductor structure may further comprise first metal semiconductor alloy regions abutting the first semiconductor substrate and comprising an alloy of a first metal and the first semiconductor material and abutting the first contact vias and second metal semiconductor alloy regions abutting the second semiconductor substrate and comprising an alloy of a second metal and the second semiconductor material and abutting the second contact vias.

According to another aspect of the present invention, a method of forming a semiconductor structure is provided, which comprises:

forming a first set of semiconductor devices directly on a first semiconductor substrate comprising a first semiconductor material having a first melting point;

forming a first via-level dielectric layer and first contact vias on the first set of semiconductor devices;

forming a second semiconductor substrate comprising a second semiconductor material having a second melting point over the first via-level dielectric layer, wherein the second melting point is lower than the first melting point; and forming a second set of semiconductor devices directly on the second semiconductor substrate.

The method may further comprise forming a second via-level dielectric layer and second contact vias on the second set of semiconductor devices, and forming inter-substrate vias electrically connected to the first set of semiconductor devices through the second via-level dielectric layer and the first via-level dielectric layer.

Formation of the second semiconductor layer may be effected by forming a planar dielectric layer on the first via-level dielectric layer, and bonding a bottom surface of the second semiconductor substrate directly on a top surface of the planar dielectric layer. Alternately, formation of the second semiconductor layer may be effected by forming a planar dielectric layer on the first via-level dielectric layer, and forming the second semiconductor substrate directly on a top surface of the planar dielectric layer by deposition of the second semiconductor material.

DETAILED DESCRIPTION OF THE INVENTION

As stated above, the present invention relates to a three-dimensional integrated semiconductor structure employing heterogeneous semiconductor layers, and methods of manufacturing the same, which are now described in detail with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Figure 1:
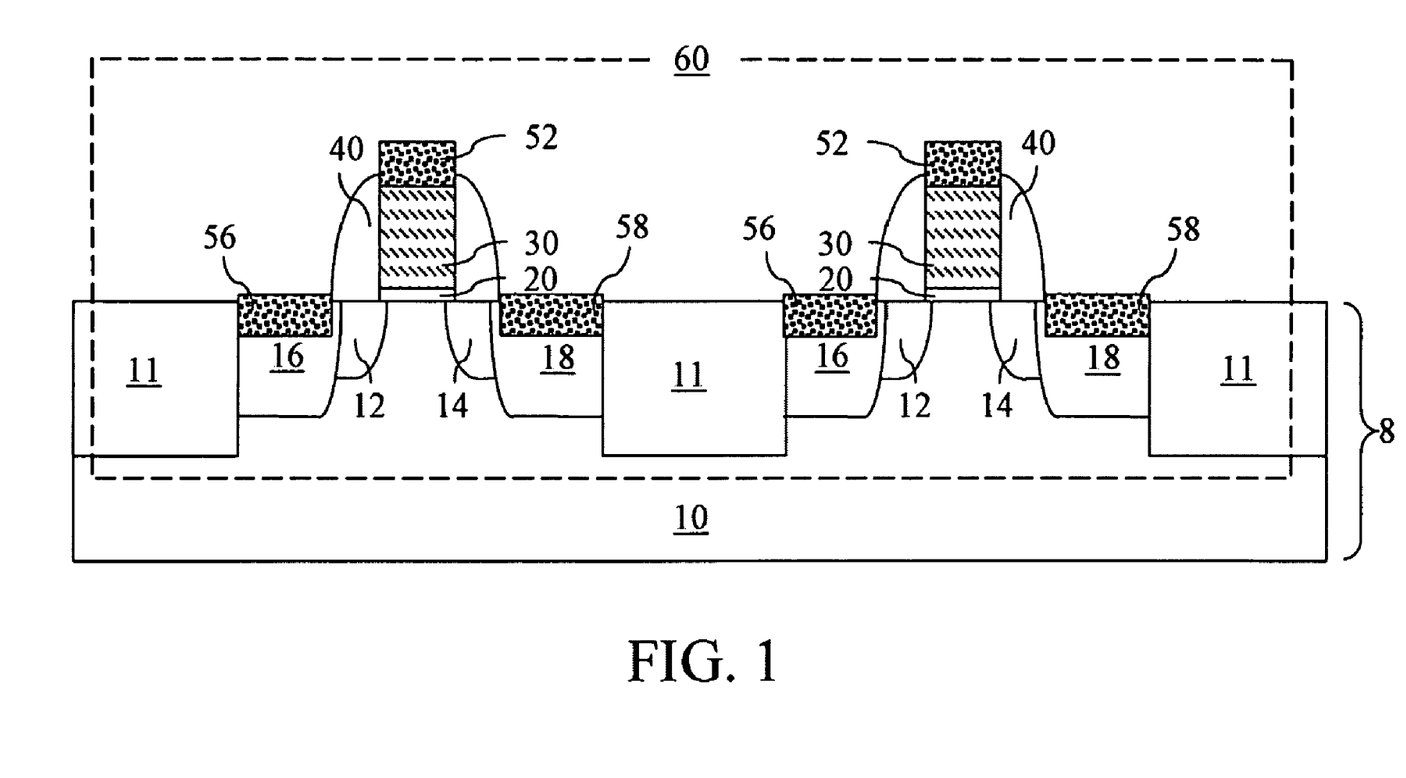
FIG. 1 is a vertical cross-sectional view of a first exemplary semiconductor structure after formation of a first set of semiconductor devices 60 on a first semiconductor substrate 8 according to a first embodiment of the present invention.

Referring to FIG. 1, a first exemplary semiconductor structure according to a first embodiment of the present invention comprises a first semiconductor substrate 8 containing a first semiconductor layer 10 and first shallow trench isolation structures 11. A first set of semiconductor devices 60 is formed on the first semiconductor substrate 8. The first set of semiconductor devices 60 includes at least one field effect transistor, each comprising a source extension region 12, a drain extension region 14, a source region 16, a drain region 18, a gate dielectric 20, a gate electrode 30, and a gate spacer 40. A portion of the first semiconductor layer 10 located directly underneath each of the gate dielectric 20 and between a pair of a source extension region 12 and a drain extension region 14 comprises a body of a field effect transistor. In each field effect transistor, the source extension region 12, the drain extension region 14, the source region 16, and the drain region 18 may have a doping of an opposite conductivity type than the body of the field effect transistor. Different portions of the first semiconductor layer 10 may be doped with different dopant conductivity types corresponding to p-type devices and n-type devices. For example, some of the field effect transistors may be p-type field effect transistors and some other field effect transistors may be n-type field effect transistors.

The first semiconductor substrate 8 comprises a first semiconductor material having a first melting point. The entirety of the first semiconductor layer 10 comprises the first semiconductor material. In one embodiment, all of the source extension regions 12, the drain extension regions 14, the source regions 16, and the drain regions 18 in the first semiconductor substrate 8 comprise the first semiconductor material. Preferably, the entirety of the first semiconductor layer 10, the source extension regions 12, the drain extension regions 14, the source regions 16, and the drain regions 18 in the first semiconductor substrate 8 is single crystalline, i.e., epitaxial, although embodiments in which at least a portion of the first semiconductor substrate 8 is polycrystalline is also explicitly contemplated herein. In another embodiment, some of the source extension regions 12, the drain extension regions 14, the source regions 16, and the drain regions 18 in the first semiconductor substrate 8 comprise the first semiconductor material, while the rest of the source extension regions 12, the drain extension regions 14, the source regions 16, and the drain regions 18 comprises a different embedded semiconductor material. Preferably, the entirety of the first semiconductor layer 10, the source extension regions 12, the drain extension regions 14, the source regions 16, and the drain regions 18 in the first semiconductor substrate 8 is single crystalline, i.e., epitaxial, although embodiments in which at least a portion of the first semiconductor substrate 8 is polycrystalline is also explicitly contemplated herein.

The first semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The first semiconductor material is selected as one of a pair of semiconductor materials having two different melting points from the list above. Specifically, the pair of semiconductor materials of the present invention comprises the first semiconductor material having the first melting point and a second semiconductor material having a second melting point. The first semiconductor material and the second semiconductor material are selected such that the first melting point is higher than the second melting point. The second semiconductor material is subsequently employed in a second semiconductor substrate as will be described below.

The first semiconductor substrate 8 may be a bulk substrate in which the first semiconductor layer 10 extends to a bottom surface of the first semiconductor substrate 8. Alternately, the first semiconductor substrate 8 may be a semiconductor-on-insulator (SOI) substrate containing a buried insulator layer (not shown) located directly on a bottom surface of the semiconductor layer and a handle layer located directly on a bottom surface of the buried insulator layer. Further, embodiments in which the first semiconductor substrate 8 is a hybrid substrate containing a bulk portion and a semiconductor-on-insulator portion are explicitly contemplated herein.

Various first metal semiconductor alloy regions may be formed on the first semiconductor substrate 8 by reacting of a metal with the first semiconductor material. The various first metal semiconductor alloy regions may include, for example, a source-side first metal semiconductor alloy region 56 formed directly on the source region 16 and a drain-side first metal semiconductor alloy region 58, which are formed in a field effect transistor. The various first metal semiconductor alloy regions (56, 58) comprise an alloy of a first metal and the first semiconductor material. Exemplary materials for the first metal include transition metals, Lanthanides, and Actinides. In case the first semiconductor material comprises silicon, the various first metal semiconductor alloy regions (56, 58) comprise a metal silicide. In case the first semiconductor material comprises germanium, the various first metal semiconductor alloy regions (56, 58) comprise a metal germanide. In case the first semiconductor material comprises a compound semiconductor material, the various first metal semiconductor alloy regions (56, 58) comprise an alloy of the first metal and the compound semiconductor material. In additional, gate-level metal semiconductor alloys 52 may be formed on top of the gate electrodes 30 if the gate electrodes comprise a semiconductor material, which may, or may not, be the same as the first semiconductor material.

While the present invention is described with field effect transistors for the first set of semiconductor devices 60, any other type of semiconductor devices may be employed as the first set of semiconductor devices 60, which may include diodes, bipolar junction transistors, capacitors, varactors, inductors, etc. Such variations are explicitly contemplated herein.

Figure 2:
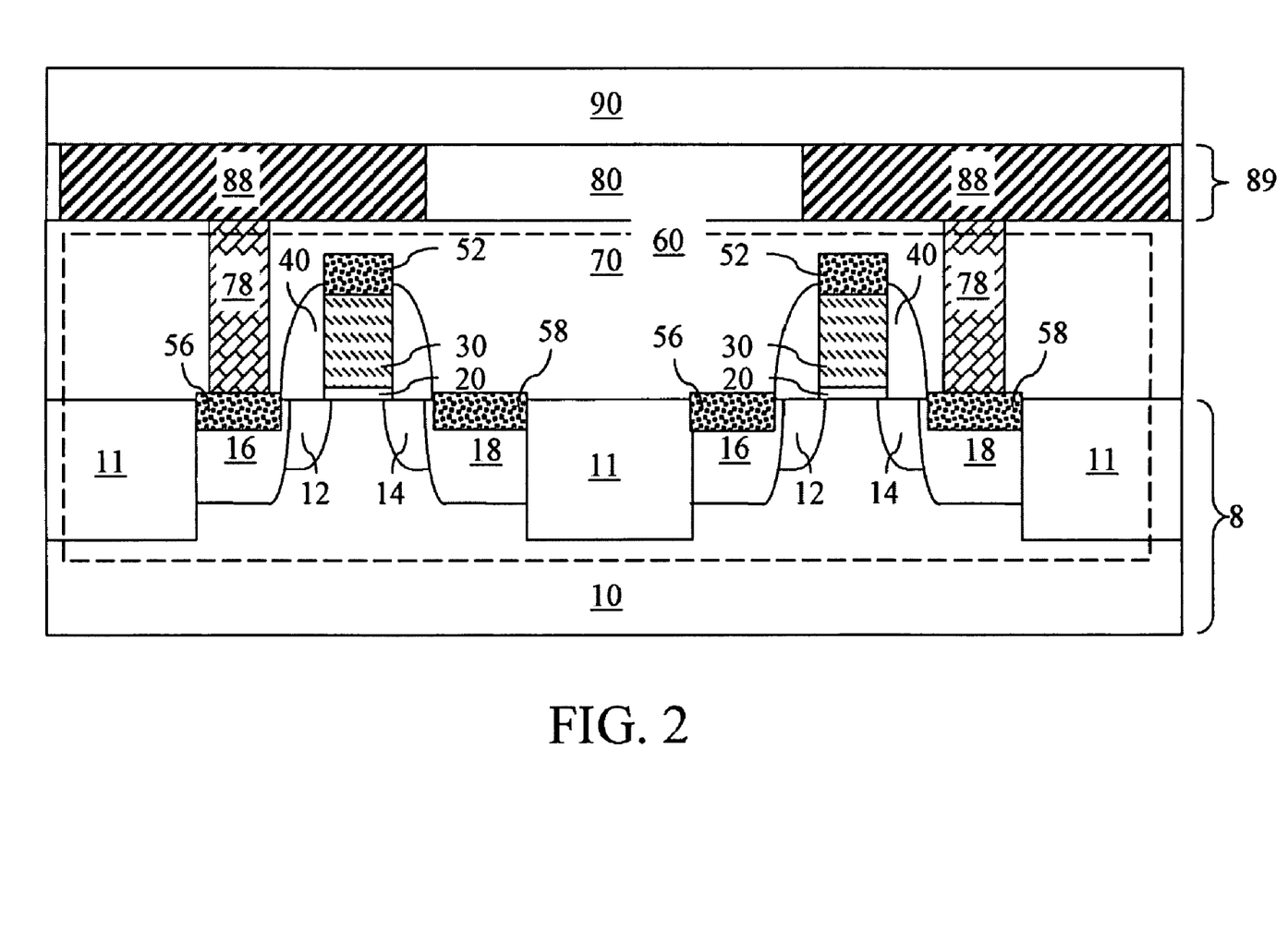
FIG. 2 is a vertical cross-sectional view of the first exemplary semiconductor structure after formation of a first via-level dielectric layer 70, first contact vias 78, a first interconnect level dielectric layer 80, a first set of metal lines 88, and a planar dielectric layer 90 according to the first embodiment of the present invention.

Referring to FIG. 2, a first via-level dielectric layer 70 is formed over the first set of semiconductor devices 60. The first via-level dielectric layer 70 comprises a dielectric material. In one case, the dielectric material of the first via-level dielectric layer 70 comprises an oxide based dielectric material, which has a dielectric constant k from about 3.6 to about 4.1. In another case, the dielectric material of the first via-level dielectric layer 70 comprises a low-k dielectric material, which has a dielectric constant k of about 3.0 or less, preferably less than about 2.8, and more preferably less than about 2.5. Non-limiting examples of the oxide based dielectric material included undoped silicate glass (USG), fluorosilicate glass (FSG), borophosphosilicate glass (BPSG), and phosphosilicate glass (PSG). Oxide based dielectric materials may be formed by chemical vapor deposition such as plasma enhanced chemical vapor deposition (PECVD), high density plasma chemical vapor deposition (HDPCVD), etc. An exemplary precursor that may be employed to form the oxide based dielectric material is tetra-ethyl-ortho-silicate (TEOS). Other precursors may also be employed to form a film of the oxide based dielectric material.

The first via-level dielectric layer 70 may comprise a spin-on low-k dielectric material, i.e., a spin-on dielectric material having a dielectric constant less than 3.0. An example of the spin-on low-k dielectric material is a thermosetting polyarylene ether, which is also commonly referred to as "Silicon Low-K", or "SiLK™." The term "polyarylene" is used herein to denote aryl moieties or inertly substituted aryl moieties which are linked together by bonds, fused rings, or inert linking groups such as oxygen, sulfur, sulfone, sulfoxide, carbonyl, etc.

The first via-level dielectric layer 70 may comprise a CVD low-k dielectric material, i.e., a low-k dielectric material deposited by chemical vapor deposition (CVD), which includes porous or non-porous organosilicate glass (OSG) and SiCOH based low dielectric constant (low-k) chemical vapor deposition (CVD) materials having a dielectric constant less than 3.0. Composition and deposition methods of the CVD low-k dielectric material are well known in the art. SiCOH based low-k CVD materials contain a matrix of a hydrogenated oxidized silicon carbon material (SiCOH) comprising atoms of Si, C, O and H in a covalently bonded tri-dimensional network.

Both the spin-on low-k dielectric material and the CVD low-k dielectric material may be porous, which decreases the dielectric constant of the first via-level dielectric layer 70. The first via-level dielectric layer 70 may comprise a stack of at least two of the oxide based conventional dielectric material, the spin-on low-k dielectric material, and the CVD low-k dielectric material.

The thickness of the first via-level dielectric layer 70 may be 50 nm to about 1 μm, with a thickness from 100 to about 500 nm being more typical, although lesser and greater thicknesses are explicitly contemplated herein.

The first via-level dielectric layer 70 may be planarized at this point, for example, by chemical mechanical planarization (CMP). Preferably, the top surface of the first via-level dielectric layer 70 is located above the entirety of the first set of semiconductor devices 60 after the planarization.

Via holes extending to the top surfaces of the first set of semiconductor devices 60 are formed in the first via-level dielectric layer 70 by lithographic means, e.g., by application of a photoresist (not shown), lithographic exposure and development, transfer of the pattern in the photoresist into the first via-level dielectric layer 70 by an anisotropic etch, and removal of the photoresist. A conductive material is deposited within the via holes and planarized employing a top surface of the first via-level dielectric layer 70 as a stopping layer to form first contact vias 78, which extend from the top surface of the first via-level dielectric layer 70 to the first set of semiconductor devices 60. For example, the first contact vias 78 may vertically abut some of the various first metal semiconductor alloy regions (56, 58). The first contact vias 78 may comprise an elemental metal, a conductive metal nitride or a conductive metal oxide, or an alloy thereof.

A first interconnect level dielectric layer 80 is formed directly on the top surface of the first via-level dielectric layer 70 and the top surfaces of the first contact vias 78. The first interconnect level dielectric layer 80 comprises a dielectric material. Exemplary dielectric materials for the first interconnect level dielectric layer 80 include oxide based dielectric materials and low-k dielectric materials described above, i.e., any of the material for the first via-level dielectric layer 70 may be employed for the first interconnect level dielectric layer 80.

A first set of metal lines 88 is formed in the first interconnect level dielectric layer 80 by a damascene method or by equivalent methods for formation of interconnect lines. The first set of metal lines 88 may be formed, for example, by applying and patterning a photoresist (not shown) over the first interconnect level dielectric layer 80, transfer of the pattern into the first interconnect level dielectric layer 80 to form line troughs, filling of the line troughs with a conductive material such as a metal, and planarization of the conductive material so that the remaining portion of the conductive material in the first interconnect level dielectric layer 80 constitutes the first set of metal lines 88. Preferably, but not necessarily, the top surface of the first interconnect level dielectric layer 80 is planar at this step. The first interconnect level dielectric layer 80 and the first set of metal lines 88 collectively constitute a first interconnect level 89.

While the present invention is described with separate processing steps for the formation of the first via-level dielectric layer 70 and the first interconnect level dielectric layer 80 and separate processing steps for the formation of the first contact vias 78 and the first set of metal lines 88, a dual damascene processing steps may be employed instead in which the first via-level dielectric layer 70 and the first interconnect level dielectric layer 80 are formed in the same deposition step and the first contact vias 78 and the first set of metal lines 88 are formed simultaneously by a single deposition step for a semiconductor material and a single planarization process. In this case, the first via-level dielectric layer 70 and the first interconnect level dielectric layer 80 are integrally formed and have the same composition. Such variations are explicitly contemplated herein.

A planar dielectric layer 90 is formed on the top surface of the first interconnect level dielectric layer 80. In one embodiment, the planar dielectric layer 90 comprises a dielectric material that may be bonded to a semiconductor substrate comprising the second semiconductor material described above, i.e., a semiconductor material having a lower melting point than the first semiconductor material. For example, the planar dielectric layer 90 may comprise a silicon oxide based dielectric material such as undoped silicate glass (USG), borosilicate glass (BSG), phosphosilicate glass (PSG), borophosphosilicate glass (BPSG), arsenosilicate glass (ASG), etc. The planar dielectric layer 90 may be formed by chemical vapor deposition such as low pressure chemical vapor deposition (LPCVD), rapid thermal chemical vapor deposition (RTCVD), plasma enhanced chemical vapor deposition (PECVD), high density plasma chemical vapor deposition (HDPCVD), etc.

In another embodiment, the planar dielectric layer 90 may comprise any dielectric material on which a second dielectric material may be deposited with sufficient adhesion strength. In this case, exemplary dielectric materials for the planar dielectric layer 90 include oxide based dielectric materials and low-k dielectric materials described above, i.e., any of the material for the first via-level dielectric layer 70 or the first interconnect level dielectric layer 80 may be employed for the planar dielectric layer 90.

The thickness of the planar dielectric layer 90 may be from about 50 nm to about 1,000 nm, and typically from about 100 nm to about 300 nm, although lesser and greater thicknesses are also explicitly contemplated herein. Preferably, the top surface of the planar dielectric layer 90 is planar to facilitate subsequent formation of a second semiconductor layer.

Figure 3:
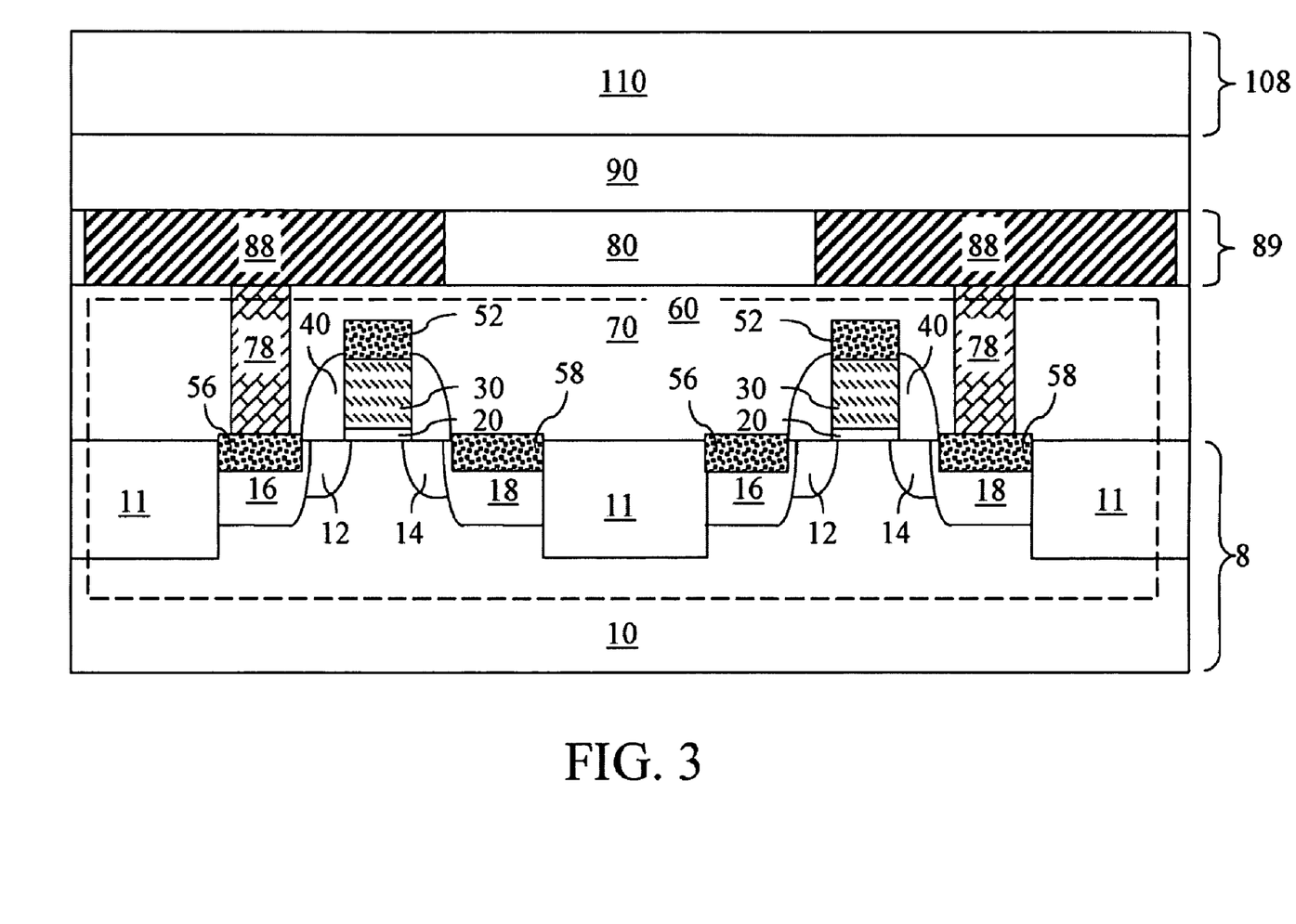
FIG. 3 is a vertical cross-sectional view of the first exemplary semiconductor structure after formation of a second semiconductor substrate 108 directly on the planar dielectric layer 90 according to the first embodiment of the present invention.

Referring to FIG. 3, a second semiconductor substrate 108 is formed directly on the top surface of the planar dielectric layer 90. The second semiconductor substrate 108 comprises the second semiconductor material described above, i.e., one of the semiconductor materials having a lower melting point than the first semiconductor material. The entirety of the second semiconductor substrate 108 comprises a second semiconductor layer 110 at this point.

In case the planar dielectric layer 90 comprises a dielectric material that may be bonded to the second semiconductor substrate 108, the second semiconductor substrate 108 may be single crystalline or polycrystalline. The second semiconductor substrate 108 is bonded to the top surface of the planar dielectric layer 90 by methods known in the art. For example, a carrier substrate comprising the second semiconductor substrate 108 and a release substrate (not shown) may be bonded such that the second semiconductor substrate 108 is adjoined to the planar dielectric layer 90. The carrier substrate may contain a hydrogen implanted layer between the second semiconductor substrate 108 and the release substrate. After bonding, the release substrate is released from the second semiconductor substrate 108 at the hydrogen implanted layer. The thickness of the second semiconductor substrate 108, which is the same as the thickness of the second semiconductor layer 110, may be from about 20 nm to about 3,000 nm, and preferably from about 50 nm to about 300 nm, although lesser and greater thicknesses are also contemplated herein.

In case the second semiconductor substrate 108 is formed by deposition, i.e., the second semiconductor material is formed by deposition, the second semiconductor substrate 108 may is typically polycrystalline. The second semiconductor substrate 108 may be formed by chemical vapor deposition (CVD), sputtering, evaporation, molecular beam deposition, atomic layer deposition, etc. The thickness of the second semiconductor substrate 108, which is the same as the thickness of the second semiconductor layer 110, may be from about 20 nm to about 3,000 nm, and preferably from about 50 nm to about 300 nm in this case, although lesser and greater thicknesses are also contemplated herein.

Figure 4:
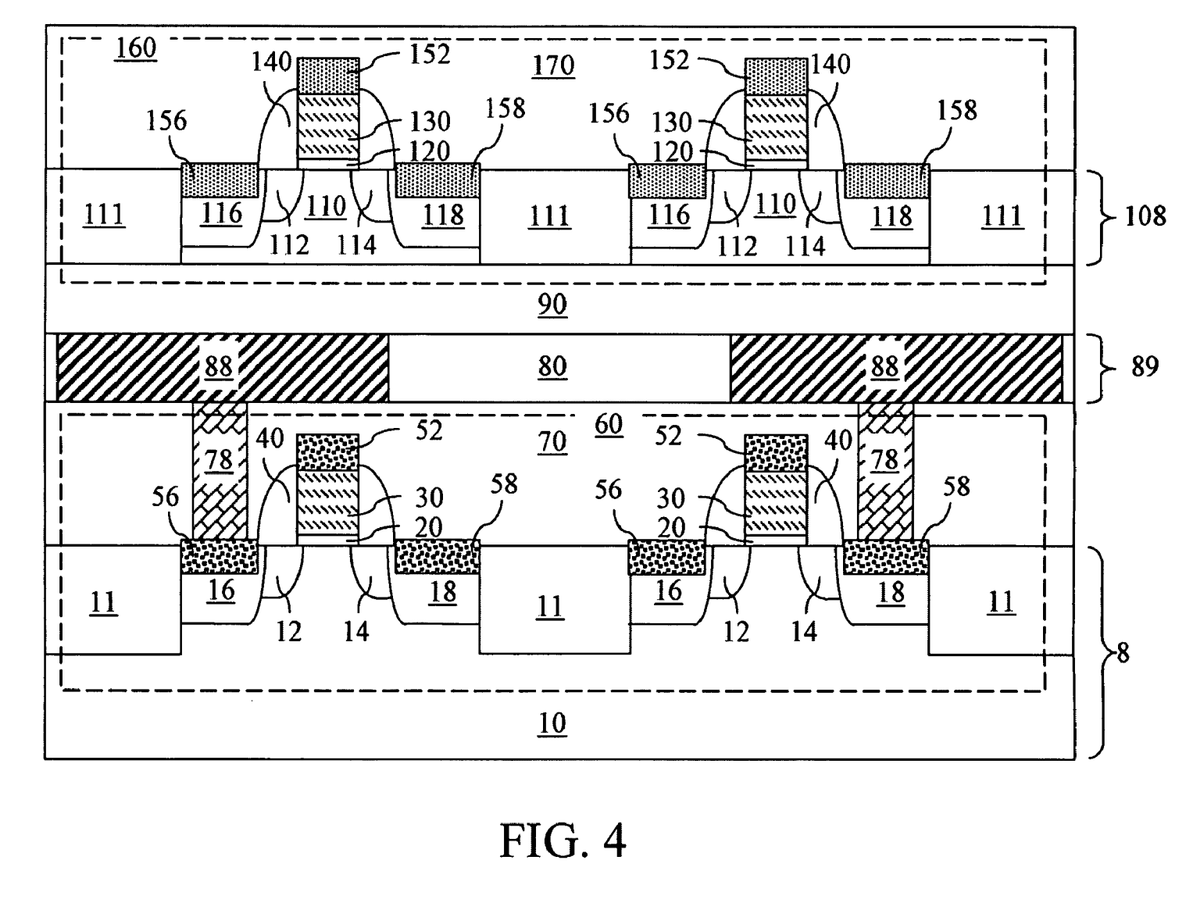
FIG. 4 is a vertical cross-sectional view of the first exemplary semiconductor structure after formation of a second via-level dielectric layer 170 according to the first embodiment of the present invention.

Referring to FIG. 4, second shallow trench isolation structures 111 are formed in the second semiconductor substrate 108 by formation of shallow trenches, followed by deposition of a dielectric material and planarization. The second shallow trench isolation structures 111 may, or may not, extend to a top surface of the planar dielectric layer 90. The second shallow trench isolation structures 111 are aligned to the first set of metal lines 88 such that a portion of the shallow trench isolation structures 111 overlie a portion of the first set of metal lines 88.

A second set of semiconductor devices 160 is formed on the second semiconductor substrate 108. The second set of semiconductor devices 160 includes at least another field effect transistor, each comprising a source extension region 112, a drain extension region 114, a source region 116, a drain region 118, a gate dielectric 120, a gate electrode 130, and a gate spacer 140. A portion of the second semiconductor layer 110 located directly underneath each of the gate dielectric 120 and between a pair of a source extension region 112 and a drain extension region 114 comprises a body of a field effect transistor. In each field effect transistor, the source extension region 112, the drain extension region 114, the source region 116, and the drain region 118 may have a doping of an opposite conductivity type than the body of the field effect transistor. Different portions of the second semiconductor layer 110 may be doped with different dopant conductivity types corresponding to p-type devices and n-type devices. For example, some of the field effect transistors may be p-type field effect transistors and some other field effect transistors may be n-type field effect transistors.

The entirety of the second semiconductor layer 110 comprises the second semiconductor material. In one exemplary case, the first semiconductor material is silicon and the second semiconductor material is a silicon germanium alloy, which has a lower melting point than silicon. In another exemplary case, the first semiconductor material is silicon and the second semiconductor material is germanium, which has a lower melting point than silicon. In yet another exemplary case, the first semiconductor material is silicon and the second semiconductor material is a compound semiconductor material that has a lower melting point than silicon. In even another exemplary case, the first semiconductor material is germanium and the second semiconductor material is a compound semiconductor material having a lower melting point than germanium. In still another exemplary case, the first semiconductor material is a first compound semiconductor material and the second semiconductor material is a second compound semiconductor material that has a lower melting point than the melting point of the first compound semiconductor material. In general, any combination of the first semiconductor material and the second semiconductor material is practicable in the present invention provided that the first melting point, which is the melting point of the first semiconductor material, is higher than the second melting point, which is the melting point of the second semiconductor material.

The melting point is a metric of bulk diffusivity of semiconductor materials. In general, the higher the melting point, the lower the bulk diffusivity at a given temperature for the semiconductor material. By selecting the second semiconductor material as a material having a lower melting point than the first semiconductor material, the present invention enables dopant activation in the second set of semiconductor devices 160 at a lower temperature than the temperature required for dopant activation for the first set of semiconductor devices 60. In other words, less thermal cycling is needed to provide semiconductor devices with dopants sufficiently electrically activated in the second set of semiconductor devices 160 than the thermal cycling required to provide semiconductor devices with dopants sufficiently electrically activated in the first set of semiconductor devices 160.

According to the present invention, therefore, the formation of the second set of semiconductor devices 160 may be performed at a temperature that does not significantly affect the dopant distribution of the first set of semiconductor devices 60. Despite the formation of the second set of semiconductor devices 160 after the formation of the first set of semiconductor devices 60, the performance degradation of the first set of semiconductor devices 60 is therefore negligible.

In one embodiment, all of the source extension regions 12, the drain extension regions 14, the source regions 16, and the drain regions 18 in the second semiconductor substrate 108 comprise the second semiconductor material. In case the second semiconductor substrate 108 is formed by bonding, the entirety of the second semiconductor layer 110, the source extension regions 112, the drain extension regions 114, the source regions 116, and the drain regions 118 in the second semiconductor substrate 108 may be single crystalline, i.e., epitaxial, although embodiments in which at least a portion of the second semiconductor substrate 108 is polycrystalline is also explicitly contemplated herein.

In another embodiment, some of the source extension regions 12, the drain extension regions 14, the source regions 16, and the drain regions 18 in the second semiconductor substrate 108 comprise the second semiconductor material, while the rest of the source extension regions 12, the drain extension regions 14, the source regions 16, and the drain regions 18 comprises a different embedded semiconductor material. In case the second semiconductor substrate 108 is formed by bonding, the entirety of the first semiconductor layer 10, the source extension regions 12, the drain extension regions 14, the source regions 16, and the drain regions 18 may be single crystalline, i.e., epitaxial, although embodiments in which at least a portion of the semiconductor substrate 8 is polycrystalline is also explicitly contemplated herein.

Various second metal semiconductor alloy regions may be formed on the second semiconductor substrate 108 by reacting of a metal with the second semiconductor material. The various second metal semiconductor alloy regions may include, for example, a source-side second metal semiconductor alloy region 156 formed directly on the source region 116 and a drain-side second metal semiconductor alloy region 158, which are formed in a field effect transistor. The various second metal semiconductor alloy regions (156, 158) comprise an alloy of a second metal and the second semiconductor material. Exemplary materials for the second metal include transition metals, Lanthanides, and Actinides. In case the second semiconductor material comprises a silicon germanium alloy, the various second metal semiconductor alloy regions (156, 158) comprise an alloy of a metal silicide a metal germanide. In case the second semiconductor material comprises germanium, the various second metal semiconductor alloy regions (156, 158) comprise a metal germanide. In case the second semiconductor material comprises a compound semiconductor material, the various second metal semiconductor alloy regions (156, 158) comprise an alloy of the second metal and the compound semiconductor material. In additional, gate-level metal semiconductor alloys 152 may be formed on top of the gate electrodes 130 if the gate electrodes comprise a semiconductor material, which may, or may not, be the same as the second semiconductor material.

While the present invention is described with field effect transistors for the second set of semiconductor devices 160, any other type of semiconductor devices may be employed as the second set of semiconductor devices 160, which may include diodes, bipolar junction transistors, capacitors, varactors, inductors, etc. Such variations are explicitly contemplated herein.

A second via-level dielectric layer 70 is formed over the second set of semiconductor devices 160. The second via-level dielectric layer 170 comprises a dielectric material. The dielectric material of the second via-level dielectric layer 170 may comprise an oxide based dielectric material or a low-k dielectric material. The same materials that may be used for the first via-level dielectric layer 70 may be employed for the second via-level dielectric layer 170. The same deposition methods may be employed as well. The thickness of the second via-level dielectric layer 70 may be 50 nm to about 1 µm, with a thickness from 100 to about 500 nm being more typical, although lesser and greater thicknesses are explicitly contemplated herein.

The second via-level dielectric layer 170 may be planarized at this point, for example, by chemical mechanical planarization (CMP). Preferably, the top surface of the second via-level dielectric layer 170 is located above the entirety of the second set of semiconductor devices 160 after the planarization.

Figure 5:
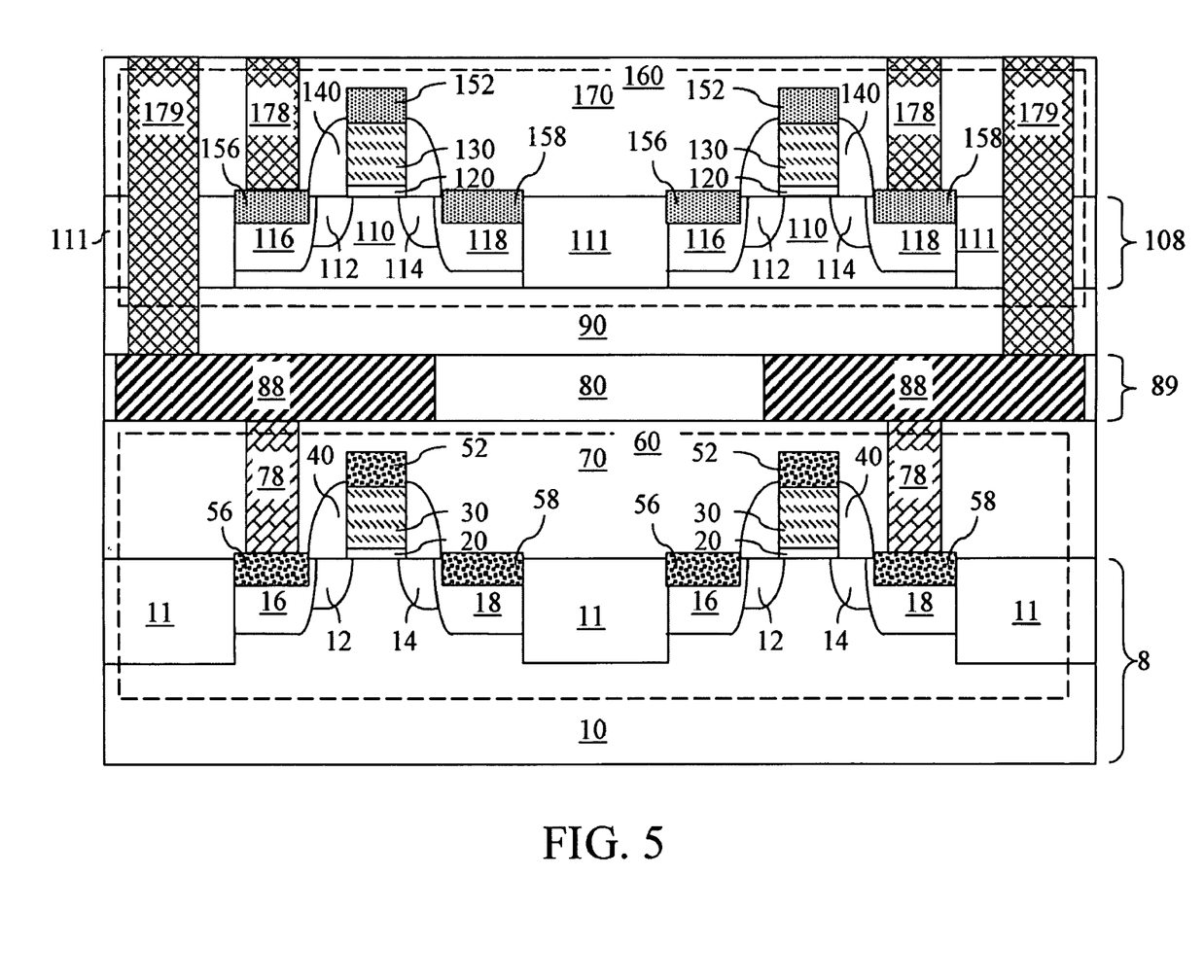
FIG. 5 is a vertical cross-sectional view of the first exemplary semiconductor structure after formation of second contact vias 178 and inter-substrate vias 179 according to the first embodiment of the present invention.

Referring to FIG. 5, two types of via holes are formed in the second via-level dielectric layer 170. Via holes of a first type that extend to the top surfaces of the second set of semiconductor devices 160 are formed outside the area of the second shallow trench isolation structures 111. The via holes of the first type are confined within the second via-level dielectric layer 170. Via holes of a second type that extend through the second via-level dielectric layer 170, the second shallow trench isolation structures 111, and the planar dielectric layer 90 are formed inside the area of the second shallow trench isolation structures 111. The via holes of the second type overlie the first set of metal lines 88 in the first interconnect level 89.

The via holes of the first type and the second type may be formed by lithographic means, e.g., by application of a photoresist (not shown), lithographic exposure and development, transfer of the pattern in the photoresist into at least one underlying dielectric layer by an anisotropic etch, and removal of the photoresist. The via holes of the first type and the via holes of the second type may be formed by separate sets of processing steps, each producing either the via holed of the first type or the via holes of the second type. For formation of via holes of the first type, the pattern in a photoresist is transferred through the second via-level dielectric layer 170 only, stopping on the top surfaces of the second set of semiconductor devices 160. For formation of via holes of the second type, the pattern in another photoresist is transferred through the second via-level dielectric layer 170, through the second shallow trench isolation structures 111, and through the planar dielectric layer 90, stopping on the top surfaces of the first set of metal lines 88.

A conductive material is deposited within the via holes of the first and second types and planarized employing a top surface of the second via-level dielectric layer 70 as a stopping layer. The portions of the conductive material remaining in the via holes of the first type constitute second contact vias 178, which extend from the top surface of the second via-level dielectric layer 170 to the second set of semiconductor devices 160. For example, the second contact vias 178 may vertically abut some of the various second metal semiconductor alloy regions (156, 158). The portions of the conductive material remaining in the via holes of the second type constitute inter-substrate vias 179, which extend from the top surface of the second via-level dielectric layer 170 through the second via-level dielectric layer 170, the second shallow trench isolation structures 111, and the planar dielectric layer 90, to the top surfaces of the first set of metal lines 88. The inter-substrate vias 179 vertically abuts some of the first set of metal lines 88. The second contact vias 178 and the inter-substrate vias 179 may comprise an elemental metal, a conductive metal nitride or a conductive metal oxide, or an alloy thereof.

Figure 6:
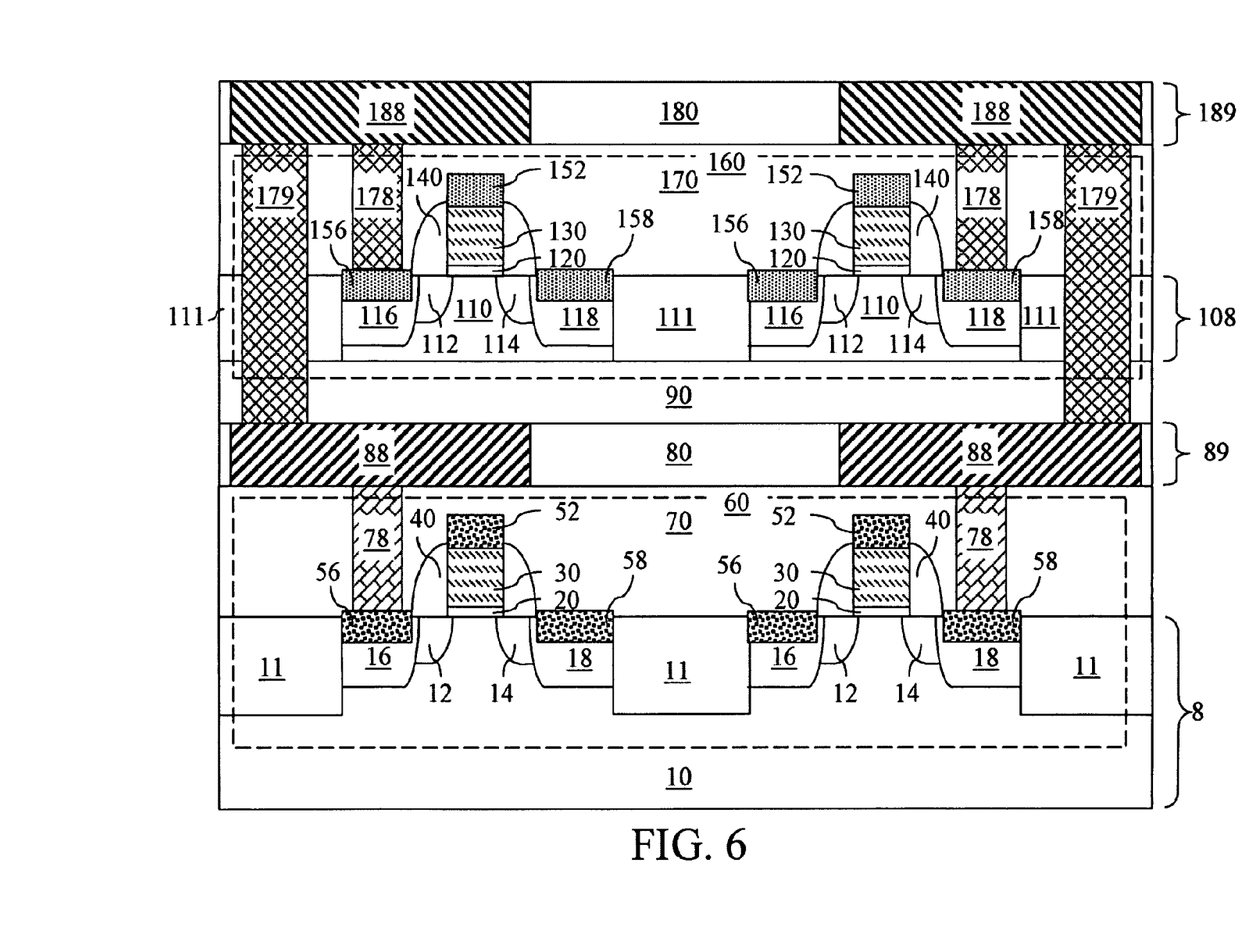
FIG. 6 is a vertical cross-sectional view of the first exemplary semiconductor structure after formation of a second interconnect level dielectric layer 180 and a second set of metal lines 188 according to the first embodiment of the present invention.

Referring to FIG. 6, a second interconnect level dielectric layer 180 is formed directly on the top surface of the second via-level dielectric layer 170 and the top surfaces of the second contact vias 78 and the inter-substrate vias 179. The second interconnect level dielectric layer 180 comprises a dielectric material. Exemplary dielectric material for the second interconnect level dielectric layer 180 include oxide based dielectric materials and low-k dielectric materials described above, i.e., any of the material for the first via-level dielectric layer 70 may be employed for the second interconnect level dielectric layer 180.

A second set of metal lines 188 is formed in the second interconnect level dielectric layer 180 by a damascene method or by equivalent methods for formation of interconnect lines. The second set of metal lines 188 may be formed, for example, by applying and patterning a photoresist (not shown) over the second interconnect level dielectric layer 180, transfer of the pattern into the second interconnect level dielectric layer 180 to form line troughs, filling of the line troughs with a conductive material such as a metal, and planarization of the conductive material so that the remaining portion of the conductive material in the second interconnect level dielectric layer 180 constitutes the second set of metal lines 188. The second set of metal lines 188 overlie and vertically abut the second contact vias 178 and the inter-substrate vias 179. The second interconnect level dielectric layer 180 and the second set of metal lines 188 collectively constitute a second interconnect level 189.

While the present invention is described with separate processing steps for the formation of the second via-level dielectric layer 170 and the second interconnect level dielectric layer 180 and separate processing steps for the formation of the second contact vias 178 and the second set of metal lines 188, a dual damascene processing steps may be employed instead in which the second via-level dielectric layer 170 and the second interconnect level dielectric layer 180 are formed in the same deposition step and the second contact vias 178 and the second set of metal lines 188 are formed simultaneously by a single deposition step for a semiconductor material and a single planarization process. In this case, the second via-level dielectric layer 170 and the second interconnect level dielectric layer 180 are integrally formed and have the same composition. Such variations are explicitly contemplated herein.

The inter-substrate vias 179 are laterally aligned to the first set of metal lines in the first interconnect level 89 to insure electrical connection of the first set of semiconductor devices 60 to the second set of metal lines 188. The second set of metal lines 188 are laterally aligned to the inter-substrate vias 179 and the second contact vias 178 so that the first set of semiconductor devices 60 is electrically connected the second set of electrical devices 160 to form a three-dimensional semiconductor structure. Unlike prior art three-dimensional semiconductor structures formed by bonding of two prefabricated semiconductor-device-containing layers that are prone to overlay variations during bonding, the three-dimensional semiconductor structure of the present invention is not prone to such overlay variations associated with wafer bonding. Instead, the overly between the first set of semiconductor devices 60 and the second set of semiconductor devices 160 is controlled by lithographic means, and specifically, by the lithographic overlay variations during the patterning of the via holes of the second type, i.e., the via holes employed to form the inter-substrate vias 179. Thus, precise alignment between the first set of semiconductor devices 60 and the second set of semiconductor devices 160 may be achieved according to the first embodiment of the present invention.

Figure 7:
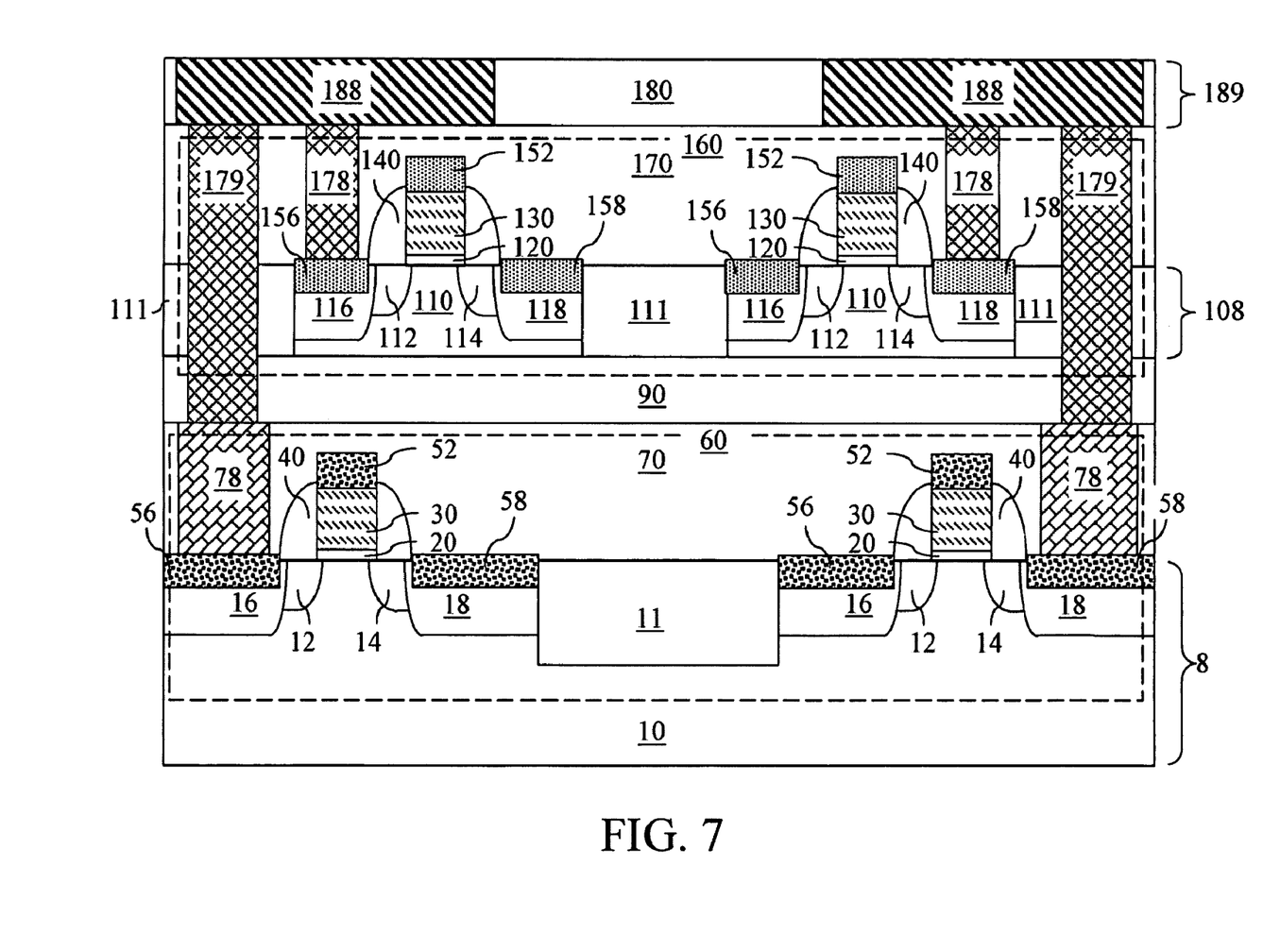
FIG. 7 is a vertical cross-sectional view of a second exemplary semiconductor structure according to a second embodiment of the present invention.

Referring to FIG. 7, a second exemplary semiconductor structure according to a second embodiment of the present invention is derived from the first exemplary semiconductor structure by omitting the formation of the first interconnect level 89. Specifically, after formation of first contact vias 78 in the first via-level dielectric layer 70, a planar dielectric layer 90 is formed directly on the top surface of the first via-level dielectric layer 70 and the top surfaces of the first contact vias 78. The first via-level dielectric layer 70 comprises the same material and may be formed by the same methods as in the first embodiment.

At the step of formation of the via holes of the second type, the via holes of the second type are formed laterally aligned to the first conductive vias 78. To facilitate the alignment, horizontal cross-sectional areas of the first contact vias may be increased. The etch that forms the via holes of the second type stops on the top surface of the first contact vias 78. The inter-substrate vias 179 is formed directly on the top surfaces of the first contact vias 78.

The lateral alignment of the inter-substrate vias 179 to the first contact vias in the first via-level dielectric layer 70 insures electrical connection of the first set of semiconductor devices 60 to the second set of metal lines 188. The second set of metal lines 188 are laterally aligned to the inter-substrate vias 179 and the second contact vias 178 so that the first set of semiconductor devices 60 is electrically connected the second set of electrical devices 160 to form a three-dimensional semiconductor structure. Precise alignment between the first set of semiconductor devices 60 and the second set of semiconductor devices 160 may be achieved as in the first embodiment.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    a first semiconductor substrate comprising a first semiconductor material having a first melting point;
    a first set of semiconductor devices located on said first semiconductor substrate;
    a via-level dielectric layer located on said first set of semiconductor devices and containing first contact vias contacting said first set of semiconductor devices;
    a planar dielectric layer locating on a top surface of said via-level dielectric layer;
    a second semiconductor substrate located over said first semiconductor substrate, said first set of semiconductor devices, and said planar dielectric layer, wherein said second semiconductor substrate comprises a second semiconductor material having a second melting point, wherein said second melting point is lower than said first melting point;
    a second set of semiconductor devices abutting said second semiconductor substrate; and
    at least one inter-substrate via vertically extending through said second semiconductor substrate and said planar dielectric layer, said at least one inter-substrate via comprising a metal, wherein no semiconductor material is embedded between a planar top surface of said planar dielectric layer and a bottom surface of said planar dielectric layer.

2. The semiconductor structure of claim 1, further comprising a planar dielectric layer vertically abutting a top surface of said via-level dielectric layer and a bottom surface of said second semiconductor substrate.

3. The semiconductor structure of claim 1, further comprising another via-level dielectric layer located on said second set of semiconductor devices and containing second contact vias contacting said second set of semiconductor devices and inter-substrate vias electrically connected to said first set of semiconductor devices.

4. The semiconductor structure of claim 3, further comprising a set of metal lines embedded in an interconnect level dielectric layer and vertically abutting said second contact vias and said inter-substrate vias.

5. The semiconductor structure of claim 4, wherein bottom surfaces of said inter-substrate vias vertically abut top surfaces of said first contact vias.

6. The semiconductor structure of claim 5, wherein said inter-substrate vias are laterally aligned to said first contact vias.

7. The semiconductor structure of claim 1, wherein said first semiconductor substrate is single crystalline and said second semiconductor substrate is single crystalline or polycrystalline.

8. The semiconductor structure of claim 1, further comprising:
    first metal semiconductor alloy regions abutting said first semiconductor substrate and comprising an alloy of a first metal and said first semiconductor material and abutting said first contact vias; and
    second metal semiconductor alloy regions abutting said second semiconductor substrate and comprising an alloy of a second metal and said second semiconductor material and abutting said second contact vias.

9. The semiconductor structure of claim 1, wherein said first semiconductor material is silicon and said second semiconductor material is a silicon germanium alloy or a compound semiconductor material.

10. The semiconductor structure of claim 1, wherein an entirety of said planar top surface of said planar dielectric is planar.

11. The semiconductor structure of claim 10, wherein said second semiconductor substrate is located directly on said planar top surface of said planar dielectric layer.

12. The semiconductor structure of claim 1, wherein said at least one inter-substrate via is conductively connected to said first contact via.

* * * * *